US005108299A

United States Patent [19]

Cronin

[11] Patent Number: 5,108,299
[45] Date of Patent: Apr. 28, 1992

[54] ELECTROSTATIC DISCHARGE PROTECTION DEVICES FOR SEMICONDUCTOR CHIP PACKAGES

[75] Inventor: David V. Cronin, Peabody, Mass.

[73] Assignee: Polaroid Corporation, Cambridge, Mass.

[21] Appl. No.: 687,044

[22] Filed: Apr. 18, 1991

[51] Int. Cl.⁵ .................... H01R 13/703; H01R 9/09
[52] U.S. Cl. .................................. 439/188; 439/189; 439/507; 361/220
[58] Field of Search ............... 439/188, 189, 507-513, 439/70, 72, 331; 206/328, 329, 331; 361/212, 220

[56] References Cited

U.S. PATENT DOCUMENTS

| | | | |
|---|---|---|---|
| 4,471,408 | 9/1984 | Martinez | 439/70 |
| 4,706,161 | 11/1987 | Buckingham | 439/72 |
| 4,971,568 | 11/1990 | Cronin | 439/188 |
| 5,038,248 | 8/1991 | Meyer | 361/421 |

Primary Examiner—Neil Abrams
Attorney, Agent, or Firm—Ralph R. Veseli

[57] ABSTRACT

A plurality of electrostatic discharge (hereafter referred to as "ESD") protection devices are disclosed for use with semiconductor chip packaging (hereafter referred to as "SCP") of the type having a top surface, a bottom surface, and, disposed between the top and bottom surface, a plurality of interface surfaces having a plurality of connector pins disposed thereon. In one embodiment, the ESD protection device comprises a base section secured to the top surface of the SCP and a plurality of integral shorting arms each extending outward from the top surface in spaced apart relationship with respect to each other and in spaced apart alignment with respect each of the connector pins. Each shorting arm has a first portion which is integral to the base section and a distal end portion integrally connected with the first portion and extending outwardly therefrom. The first portion is wider than the distal end portion and this defines a transverse edge portion which is yieldably biased by the shorting arm against a respective connector pin thereby creating an electrical connection therebetween. The plurality of connector pins subsequent insertion into corresponding complementary receptacles in a connector operates to move the distal end portion away from the repsective connector pin so as to electrically and physically disengage the transverse edge portion from the respective connector pin.

34 Claims, 10 Drawing Sheets

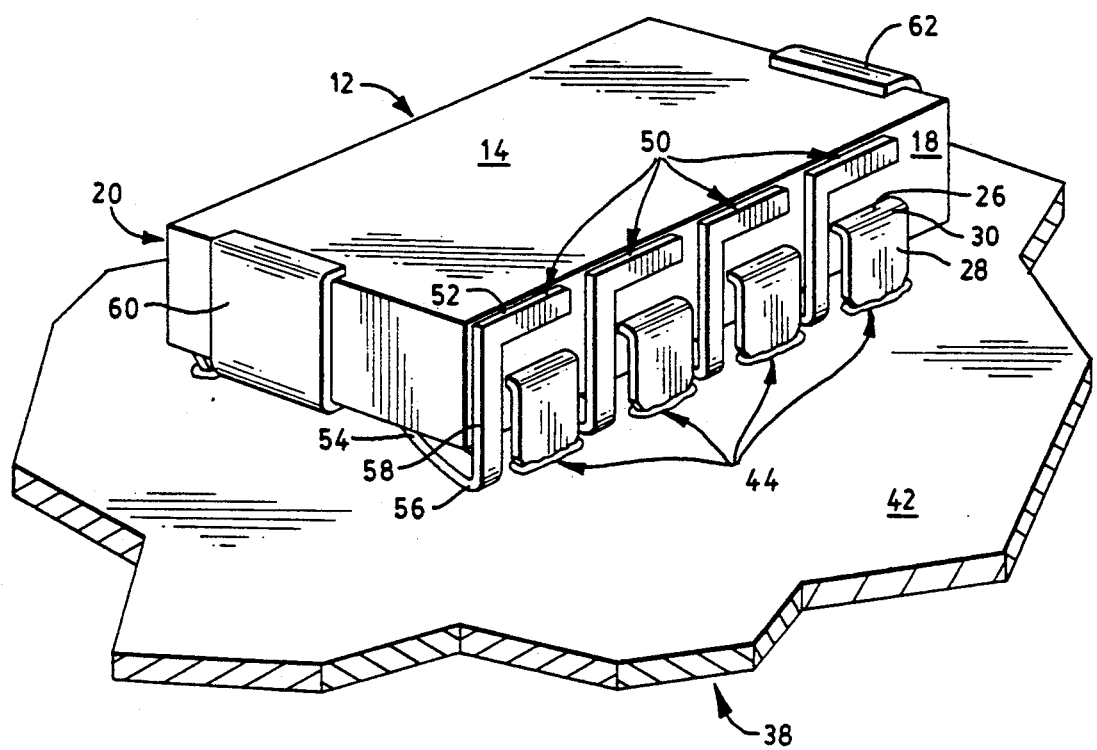
FIG. IC

ELECTROSTATIC DISCHARGE PROTECTION DEVICES FOR SEMICONDUCTOR CHIP PACKAGES

FIELD OF THE INVENTION

This invention relates to various electrostatic discharge (hereafter referred to as "ESD") protection devices for various semiconductor chip packages (hereinafter referred to as "SCP") of the type having a plurality of connector pins which are either (a) continuously shorted and then, upon insertion of the connector pins into complementary receptacles, automatically unshorted or (b) continuously shorted until the physical removal of the ESD protection device from the SCP.

BACKGROUND OF THE INVENTION

For a plurality of connector pins of a SCP which mates with a corresponding plurality of receptacles in a connector, typically, a printed circuit board, it is frequently necessary to short together the connector pins of the SCP until they are inserted into complementary receptacles in the connector in order to protect the semiconductor's circuitry from ESD. Present ESD protection devices consist primarily of ESD packaging of the SCP in electrically conductive strips, pellets, boxes and plastic tubing which provides effective ESD protection until the User is about to inserts the connector pins of the SCP into the complementary receptacles in the connector. At that point, however, the User must remove this ESD packaging from the SCP, thus rendering the SCP vulnerable to ESD, in order to position and insert the connector pins into the receptacles. Accordingly, as the User inserts the connector pins of the SCP into the receptacles, the semiconductor dies housed within these SCP's could be destroyed by ESD and would have to be replaced. Moreover certain types of SCPs typically EPROMs, UVPROMs, and DRAMs, are plug-in devices which have connector pins which are repeatedly inserted into and then removed from the receptacles. These types of SCPs require ESD protection during the repeated insertions into and removals from the receptacles. Specifically, the connector pins of these SCPs require ESD protection from the moment that their connector pins are removed from the receptacles till their connector pins are again inserted therein. Consequently, a need still exists within the semiconductor chip packaging industry for a true ESD protection device, rather than ESD packaging, which effectively protects the semiconductor die from ESD until the connector pins of the SCP are inserted into the receptacles of the connector and then protects the semiconductor die from ESD again when the connector pins are removed from their respective receptacles.

SUMMARY OF THE INVENTION

With the foregoing in mind, the primary object of the present invention is to provide an ESD protection device on a SCP which operates in a simple, economical, and effective manner to automatically short a plurality of connector pins together while the SCP is disconnected from a connector.

It is a further object of the present invention to provide an ESD protection device on a SCP which operates to automatically open the shorts between the plurality of connector pins upon the SCP's connection to a connector which has not been specifically adapted to effect such opening.

It is yet another object of the present invention to provide an ESD protection device on a SCP which operates to automatically short a plurality of connector pins until the ESD protection device is physically removed from the SCP.

According to this invention, the foregoing objects are achieved by several different ESD protection devices, each discussed below, which are disposed on the top or bottom surface of a SCP.

The SCPs are of the type that have a top surface, a bottom surface, and, disposed between the top and bottom surfaces, a plurality of interface surfaces each having a plurality of substantially parallel and evenly spaced apart connector pins disposed thereon. Each connector pin comprises a first portion extending outward from the interface surface, a second portion of substantially the same width as the first portion extending in a downward direction, a bent portion interconnecting the first and second portions, a third portion extending downward to its distal end, and an interface portion interconnecting the second and third portions.

In the first embodiment, the ESD protection device comprises a base section secured to the bottom surface of the SCP and a plurality of integral shorting arms. The plurality of shorting arms extend outwardly from the base section with their plurality of distal end portions in spaced apart relationship with respect to each other and being transversely disposed with respect to the connector pins. Each shorting arm comprises a first portion fixedly secured to the base section and extending outwardly from the bottom surface, a knee portion which extends from the first portion and below the interface portion of a respective one of the connector pins to define a bend in the shorting arm, and an intermediate portion which extends from the bend towards the respective one connector pin so that the distal end portion extends over the first portion of the respective connector pin. Each shorting arm further comprises means for yieldably biasing the shorting arm so as to urge its distal end portion against the first portion of the respective one connector pin thereby creating an electrical connection therebetween when the plurality of connector pins are not inserted into a complementary plurality of receptacles. When the connector pins are inserted into the complementary receptacles, each knee portion moves towards the bottom surface of the SCP against its yieldable bias so as to disengage its distal end portion from the first portion of a respective one of the connector pins to break the electrical connection therebetween. Finally, an adhesive disposed on the base section or a pair of clips disposed on the ends of the base section provide this ESD protection device with a secure attachment to the SCP.

In the second embodiment, the ESD protection device comprises a base section secured to the top surface of the SCP and a plurality of shorting arms and gripping members which are both integral to the base section. The plurality of shorting arms extend outwardly from the base section in spaced apart relationship with respect to each other and in spaced apart alignment with respect to the plurality of connector pins. Each shorting arm has a first portion which is integral to the base section and which extends outwardly and downwardly from the base section to define a transverse edge portion. Each transverse edge portion engages the first portion of a respective one of the connector pins so as to electrically connect the shorting arm and the connector pin. Similarly, the plurality of gripping members extend from integral connection to the base section in an interdigitated spaced apart relationship with respect to the plurality of shorting arms so as to provide the base section with support and stability against lateral movement. Each gripping member has a first portion extending along the top surface of the SCP and an integral second portion which securely grasps the SCP at an interface surface. Finally, an adhesive disposed on the base section or a pair of clips disposed on the ends of the base section provide this ESD protection device with a secure attachment to the SCP.

In the third embodiment, the ESD protection device comprises a base section secured to the top surface of the SCP and a plurality of shorting arms and gripping members which are both integral to the base section. The plurality of shorting arms extend outwardly from the base section with distal end portions in spaced apart relationship with respect to each other and in spaced apart alignment with respect to the plurality of connector pins. Each shorting arm has a first portion which is integral to the base section and which extends outwardly from the base section in an integral connection to a respective one of the distal end portions. Moreover, each first portion is wider than its distal end portion so as to define a transverse edge portion. Similarly, the plurality of gripping members extend from integral connection to the base section in an interdigitated spaced apart relationship with respect to the plurality of shorting arms so as to provide the base section with support and stability against lateral movement. Each gripping member has a first portion extending along the top surface of the SCP and an integral second portion which securely grasps the SCP at an interface surface. Each shorting arm further comprising means for yieldably biasing the shorting arm so as to urge its transverse edge portion against the first portion of the respective one of the connector pins thereby creating an electrical connection therebetween when the plurality of connector pins are not inserted into a complementary plurality of receptacles. When the connector pins are inserted into the complementary receptacles, each distal end portion of the shorting arms moves towards the bottom surface of the SCP against its yieldable bias so as to disengage its transverse edge portion from its respective connector pin to break the electrical connection therebetween. Finally, an adhesive disposed on the base section or a pair of clips disposed on the ends of the base section provide this ESD protection device with a secure attachment to the SCP.

In the fourth and final embodiment, the ESD protection device comprises a plurality of electrically conductive bars each disposed in an overlying relation with respect to the plurality of connector pins extending from each interface surface and a spring structure mounted to the top surface of the SCP for urging the plurality of conductive bars against the conductor pins. The spring structure has a central pad securely mounted with an adhesive to the top surface of the SCP and a plurality of spring members integral to the central pad and corresponding in number to the number of electrically conductive bars. Each spring member has an integral cantilevered portion fixedly secured at one end to the central pad and extending outwardly beyond the top surface and an integral pair of spaced apart depending leg portions extending downwardly on both sides of the respective plurality of connector pins and beyond the bottom surface. Each corresponding electrically conductive bar is securely mounted with an adhesive to its corresponding cantilevered portion adjacent to the interface between its cantilevered portion and its pair of leg portions so as to selectively engage its respective plurality of connector pins on an interface surface. Each spring member further comprises means for biasing the spring member to the cantilevered portion towards the top surface of the SCP so as to urge the electrically conductive bar associated therewith against its respective connector pins thereby creating an electrical connection therebetween when the SCP is not positioned against a surface of a connector. When the SCP is positioned against the surface of the connector, each cantilevered portion moves away from the top surface of the SCP against its yieldable bias so as to disengage its electrically conductive bar from its respective plurality of connector pins on the interface surface to break the electrical connection therebetween.

DESCRIPTION OF THE DRAWINGS

The novel features that are considered characteristic of the invention are set forth with particularity in the appended claims. The invention itself, however, both as to its organization and its method of operation together with other objects and advantages thereof will be best understood from the following description of the illustrated embodiment when read in connection with the accompanying drawings wherein:

FIG. 1C is a perspective view of the ESD protection device-SCP sub-assembly shown in FIG. 1B mated to a printed circuit board;

DESCRIPTION OF THE PREFERRED EMBODIMENTS

Figure 1A:
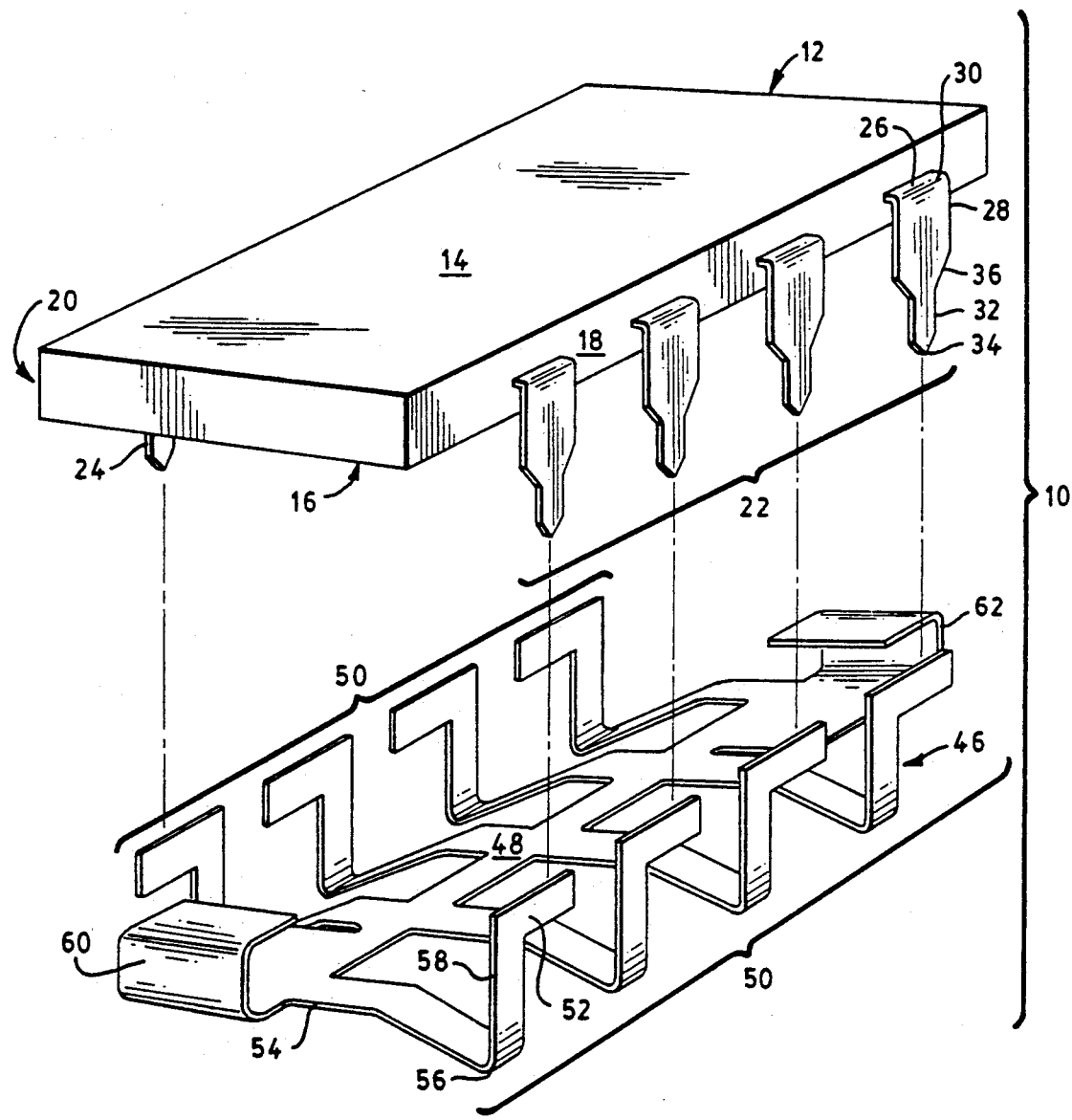
FIG. 1A is an exploded perspective view of an ESD protection device of this invention disposed below a SCP.
Figure 1B:
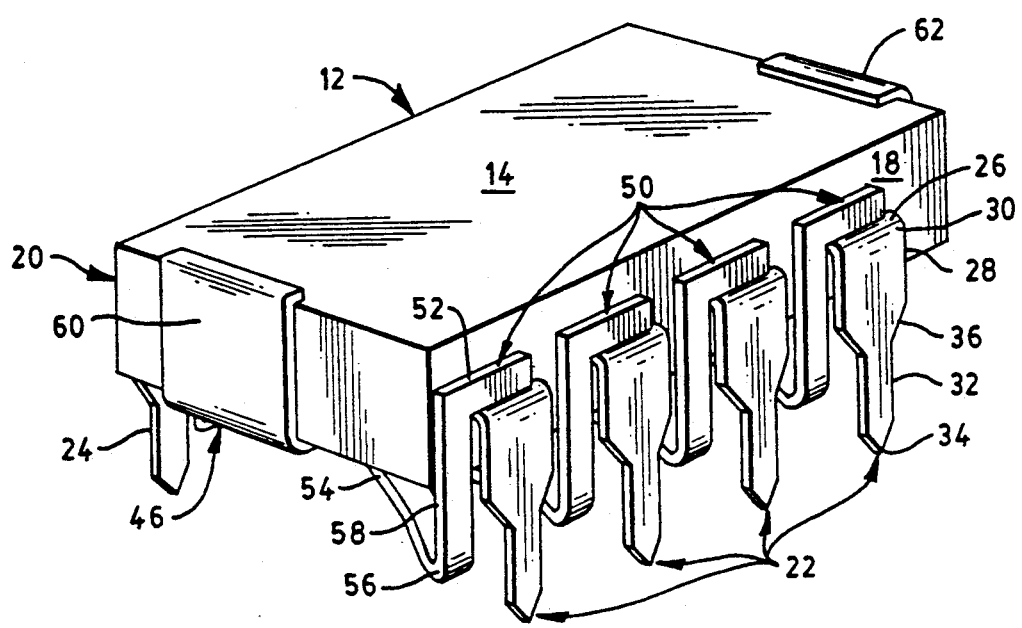
FIG. 1B is a perspective view of the ESD protection device shown in FIG. 1A mated to the bottom surface of the SCP shown in FIG. 1A.

Referring now to FIGS. 1A-1C, there is shown generally at 10 a SCP-ESD protection device combination comprising an ESD protection device 46 of this invention, a SCP 12, and a complementary connector 38. The SCP 12 in one embodiment may comprise a top surface 14, a bottom surface 16, and, between the top and bottom surfaces, a pair of interface surfaces 18 and 20. A plurality of connector pins 22 and 24, respectively, are disposed on each interface surface 18 and 20, respectively, in a substantially parallel and spaced apart relationship with respect to each other. Each of the plurality of connector pins 22, 24 further comprises a first portion 26 extending outwardly from the corresponding interface surface 18, 20, a second portion 28 of substantially the same width as the first portion 26 extending in a downward direction, a bent portion 30 interconnecting the first portion 26 and the second portion 28, a third portion 32 narrower than the first portion 26 and extending downward to its distal end 34, and an interface portion 36 which interconnects the second portion 28 and the third portion 32. As will be readily understood, the SCP 12 may house either a VLSI, LSI, or MSI semiconductor die or dies.

The plurality of the connector pins 22, 24 are adapted for physical and electrical connection to the connector 38, typically a printed circuit board, having a substantially planar surface 42 on one selected side thereof. A plurality of elongated receptacles 44 extend inwardly from the planar surface 42 in a substantially parallel spaced apart insulated relationship and in a complementary relationship with respect to the connector pins 22, 24 so as to accommodate the ready insertion of the third portion 32 of the connector pins 22, 24 into the respective ones of the receptacles 44.

In order to ensure that the connector pins 22, 24 are shorted until they are secured in the complementary receptacles 44, the ESD protection device 46 is provided. This ESD protection device 46 comprises a base section 48 secured to the bottom surface 16 of the SCP 12 and a plurality of integral shorting arms 50. The plurality of shorting arms 50 extend outwardly from the base section 48 with their distal end portions 52 in spaced apart relationship with respect to each other and transversely disposed with respect to the connector pins 22, 24, respectively. Each shorting arm 50 comprises a first portion 54 fixedly secured to the base section 48 and extending outwardly from the bottom surface 16, a knee portion 56 extending from the first portion 54 to define a bend in the shorting arm below the interface portion 36 of a respective one of the plurality of connector pins 22, 24 and an intermediate portion 58 extending from the bend towards the respective one of the plurality of connector pins 22, 24 so that the distal end portion 52 extends over the first portion 26 of the respective one of the plurality of connector pins 22, 24. An adhesive (not shown) disposed on the base section 48 or a pair of clips 60, 62 disposed on the ends of the base section provides the ESD protection device 46 with a secure attachment to the SCP 12.

The plurality of shorting arms 50 are yieldably biased by any means well known in the art such as a built in resilient spring bias so as to urge their respective distal end portions 52 against the first portions 26 of respective ones of the plurality of connector pins 22, 24 thereby creating an electrical interconnection between the plurality of shorting arms 50 and the plurality of connector pins 22, 24. Thus, as is readily apparent from FIGS. 1A-1C, when the plurality of connector pins 22, 24 are not inserted into the corresponding plurality of receptacles 44, the shorting arms 50 urge their respective distal end portions 52 against and into respective electrical connection with the first portions 26 of the respective plurality of connector pins 22, 24. In this manner, the shorting of all or some of the plurality of connector pins 22, 24 is accomplished so as to effectively protect the semiconductor die (not shown) within the SCP 12 from ESD which could operate to damage the electrical circuitry in the semiconductor die.

Insertion of the connector pins 22, 24 into the complementary receptacles 44 in the connector 38 operates to move and deflect upwards the knee portion 56 of the shorting arms 50 against their yieldable bias, thereby moving the distal end portions 52 out of physical and electrical connection with the first portions 26 of the connector pins 22, 24, respectively.

As will be readily apparent, the number of connector pins 22, 24 on either interface surface 18, 20 to be shorted together by this ESD protection device 46 need not include all the connector pins 22, 24 as shown in FIGS. 1A-1C but may also be limited to any subset of all the conductive pins. Moreover, only a subset of all the connector pins 22, 24 on just one interface surface 18, 20 may be shorted together by this ESD protection device 46 while all the other connector pins 22, 24 remain unshorted.

Figure 2A:
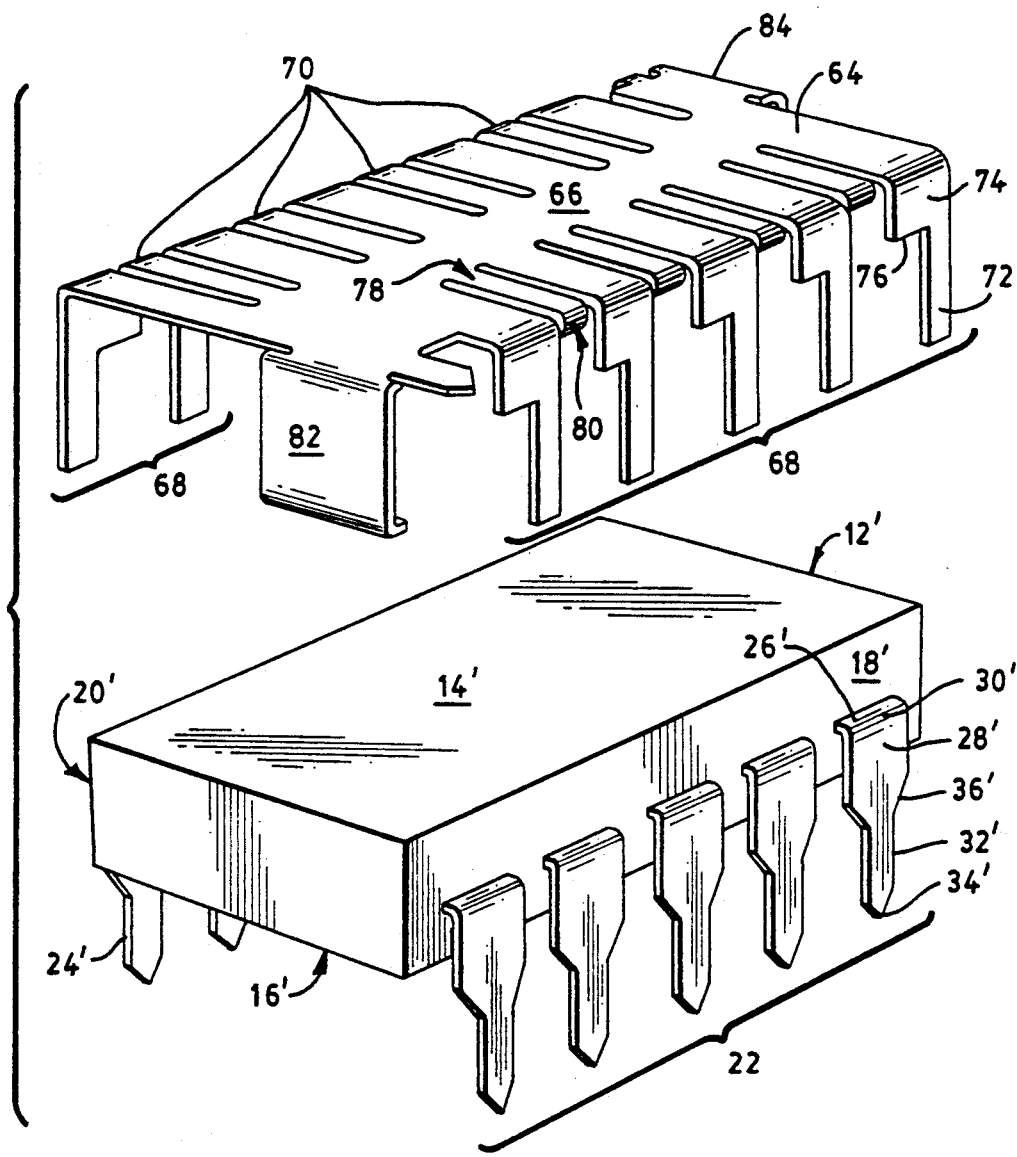
FIG. 2A is an exploded perspective view of another ESD protection device of this invention disposed above a SCP.
Figure 2B:
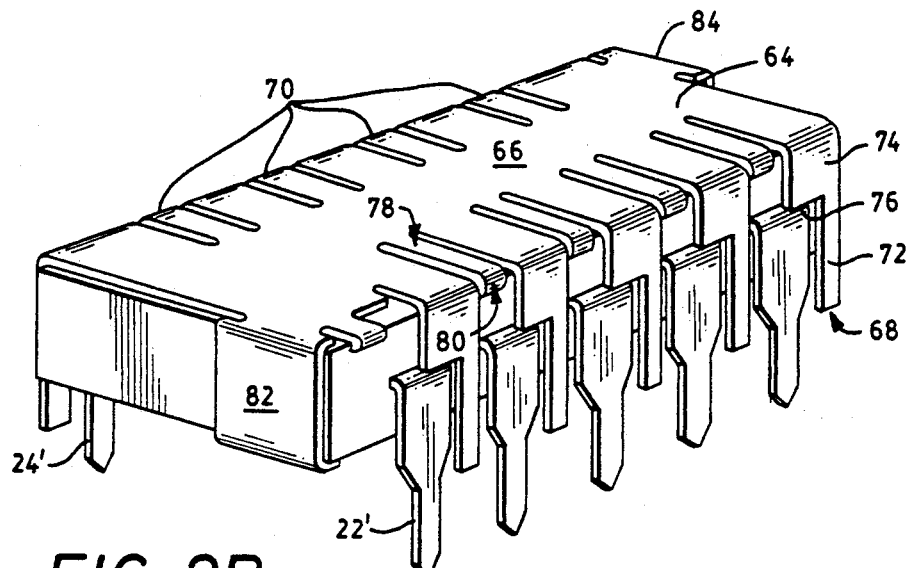
FIG. 2B is a perspective view of the ESD protection device shown in FIG. 2A mated to the top surface of the SCP shown in FIG. 2A.
Figure 2C:
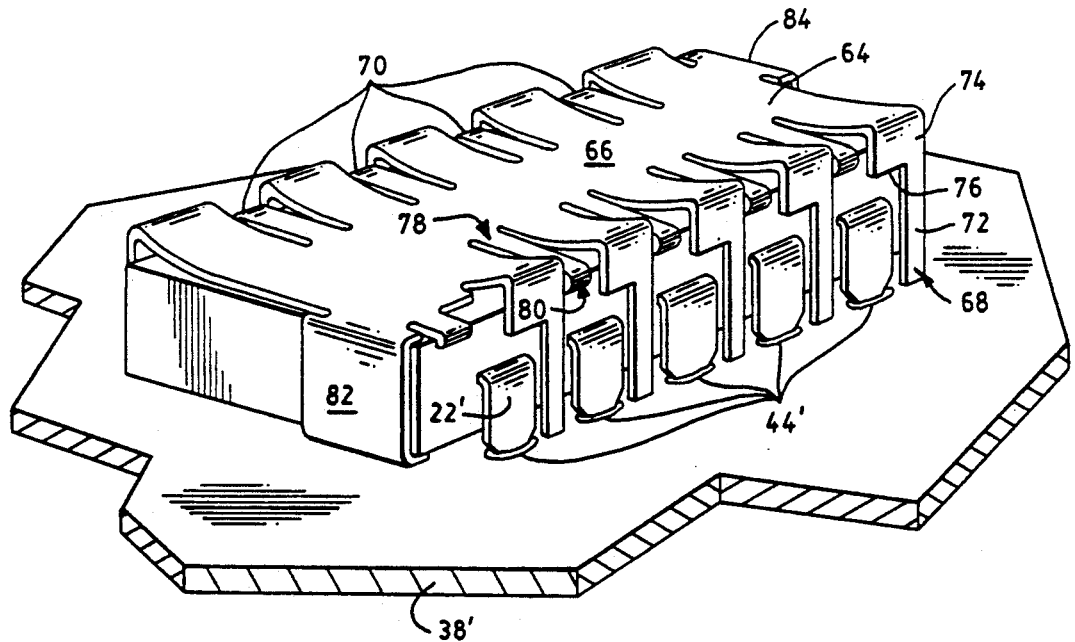
FIG. 2C is a perspective view of the ESD protection device-SCP sub-assembly shown in FIG. 2B mated to a printed circuit board.

Referring now to FIGS. 2A-2C where like numerals designate previously described elements, there is shown a second embodiment of the ESD protection device 64 for the SCP 12' and the connector 38'. In contrast to the first embodiment of the ESD protection device 46, this ESD protection device 64 is disposed on the top surface 14' of the SCP 12'. This unitary ESD protection device 64 comprises a base section 66 secured to the top surface 14' of the SCP 12' and a plurality of shorting arms 68 and gripping members 70. The plurality of shorting arms 68 extend outwardly from the base section 66 with distal end portions 72 in spaced apart relationship with respect to each other and in spaced apart alignment with respect to the plurality of connector pins 22', 24'. Each of the plurality of shorting arms 68 has a first portion 74 which is integral to the base section 66 and which extends outwardly from the base section 66 in an integral connection to a respective one of the distal end portions 72. Moreover, each first portion 74 is wider than its distal end portion 72 so as to define a transverse edge portion 76.

Similarly, the plurality of gripping members 70 extend from integral connection to the base section 66 in an interdigitated spaced apart relationship with respect to the plurality of shorting arms 68 so as to provide the base section 66 with support and stability against lateral movement. Each of the gripping members 70 has a first portion 78 extending along the top surface 14' of the SCP 12' and an integral second portion 80 which securely grasps the SCP 12' at one of the interface surfaces 18', 20'. Furthermore, an adhesive (not shown) disposed on the base section 66 or a pair of clips 82, 84 disposed on the ends of base section 66 provides the ESD protection device 64 with a secure attachment to the SCP 12'.

The shorting arms 68 are yieldably biased by means well known in the art such as a built in resilient spring bias so as to urge their respective transverse edge portions 76 against the first portions 26' of the plurality of connector pins 22', 24', respectively, thereby creating an electrical interconnection between the plurality of shorting arms 68 and the plurality of connector pins 22', 24'. Thus, as is readily apparent from FIGS. 2A-2C, when the plurality of connector pins 22', 24' are not inserted into the corresponding plurality of receptacles 44', the shorting arms 68 urge their respective transverse edge portions 76 against and into respective electrical connection with the first portions 26' of the respective plurality of connector pins 22', 24'. In this manner, the shorting of all or some of the plurality of connector pins 22', 24' is accomplished so as to effectively protect the semiconductor die (not shown) within the SCP 12' from the ESD which could operate to damage the electrical circuitry within the semiconductor die.

Insertion of the connector pins 22', 24' into the complementary receptacles 44' operates to move and deflect upwards the distal end portions 72 of the shorting arms 68 against their yieldable bias, thereby moving the transverse edge portions 76 out of respective physical and electrical connection with the first portions 26' of the connector pins 22', 24'.

As will be readily apparent, the number of connector pins 22', 24' on either interface surface 18', 20' to be shorted together by this ESD protection device 64 need not include all the connector pins 22', 24' as shown in FIGS. 2A-2C but may also be limited to any subset of all the conductive pins. Moreover, only a subset of all the connector pins 22', 24' on L just one interface surface 18', 20' may be shorted together by this ESD protection device 64 while all the other connector pins 22', 24' remain unshorted.

Figure 3A:
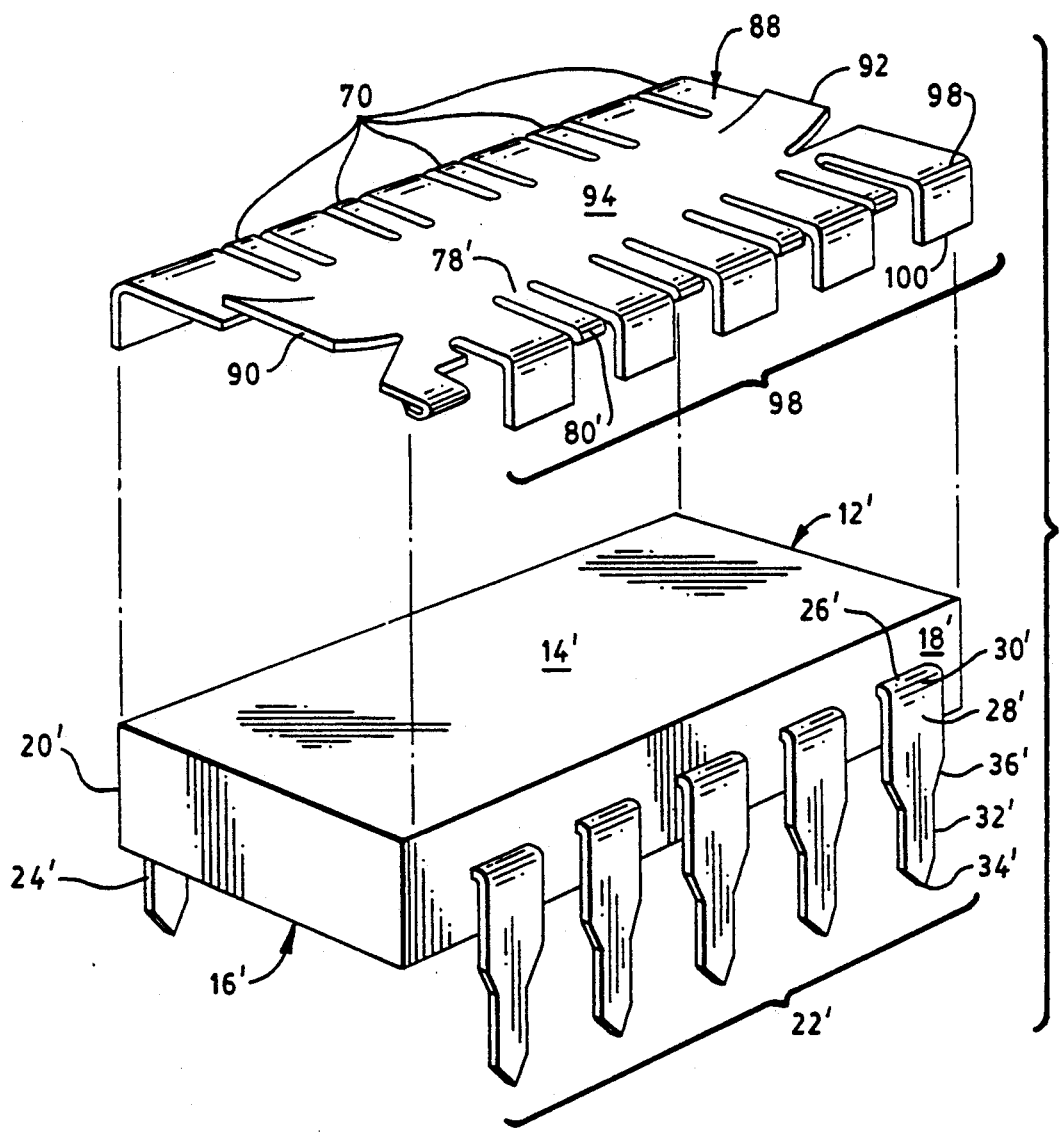
FIG. 3A is an exploded perspective view of another ESD protection device of this invention disposed above a SCP.
Figure 3B:
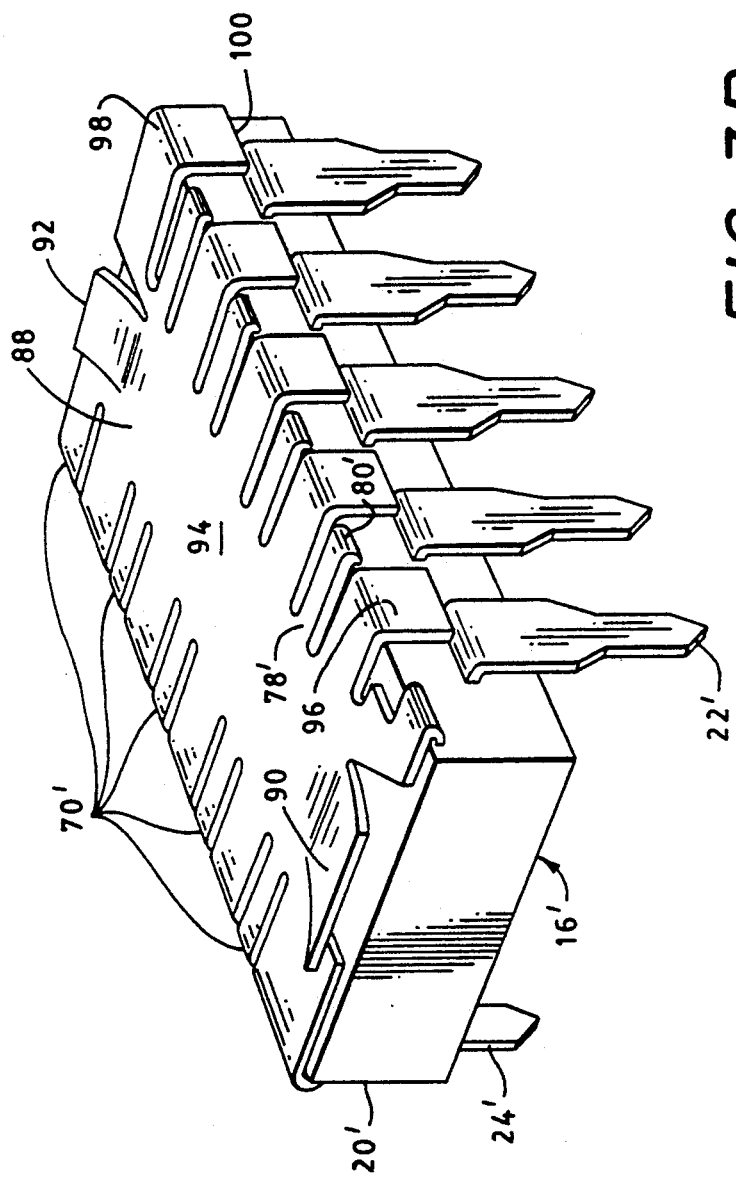
FIG. 3B is a perspective view of the ESD protection device shown in FIG. 3A mated to the to surface of the SCP shown in FIG. 3A.
Figure 4A:
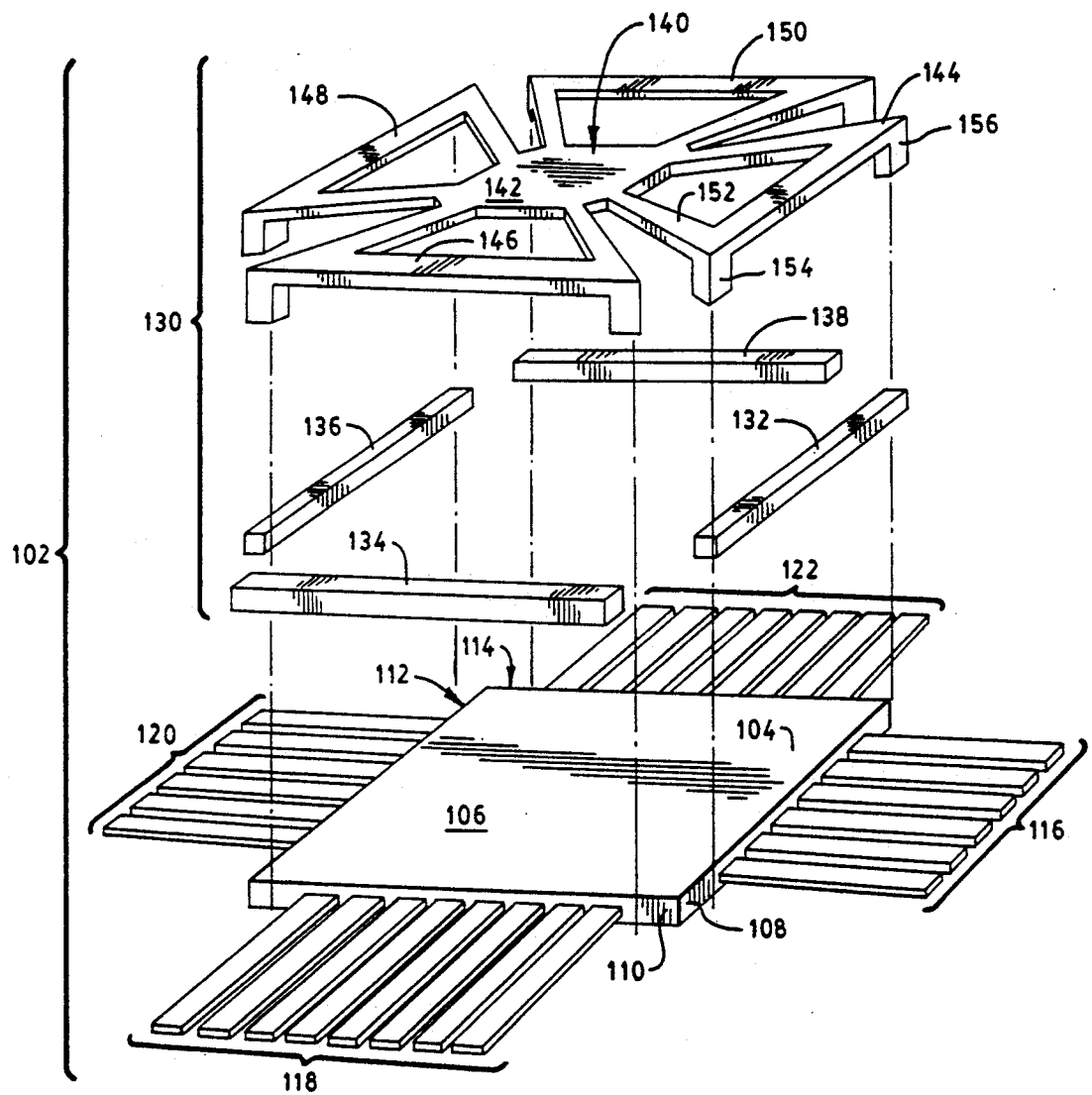
FIG. 4A is an exploded perspective view of another ESD protection device of this invention disposed above a SCP.
Figure 4B:
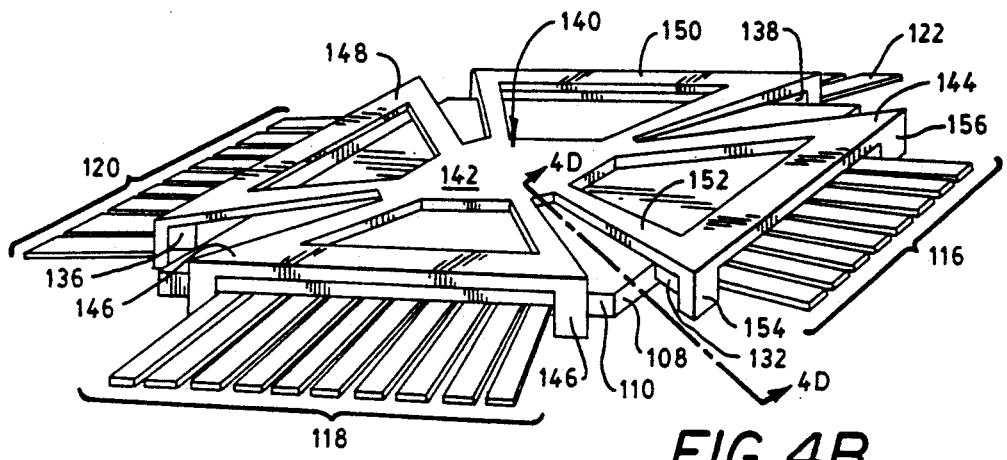
FIG. 4B is a perspective view of the ESD protection device shown in FIG. 4A mated to the top surface of the SCP shown in FIG. 4A.
Figure 4C:
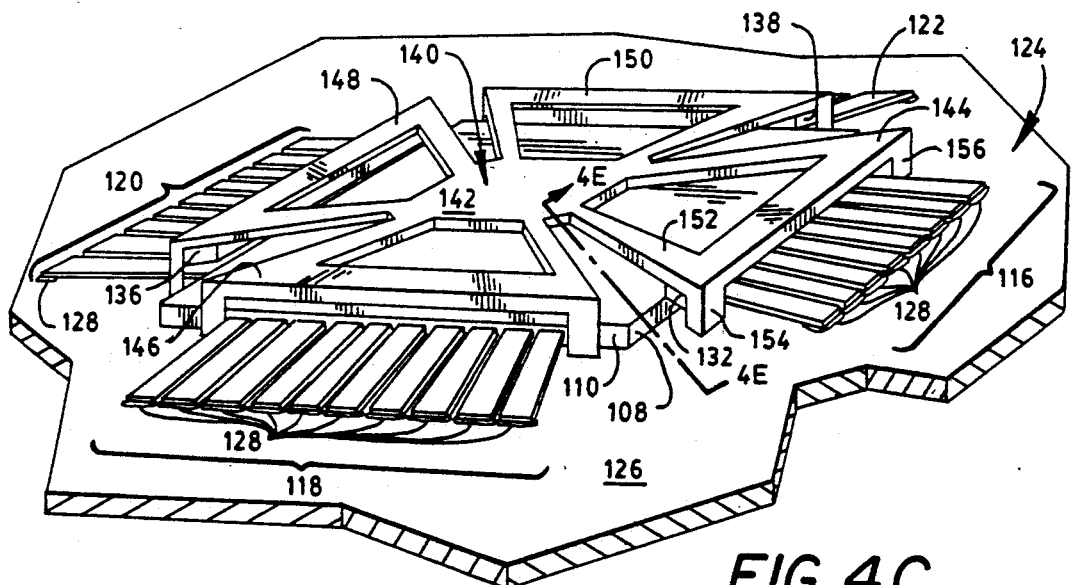
FIG. 4C is a perspective view of the ESD protection device-SCP sub-assembly shown in FIG. 4B mated to a printed circuit board.
Figure 4D:
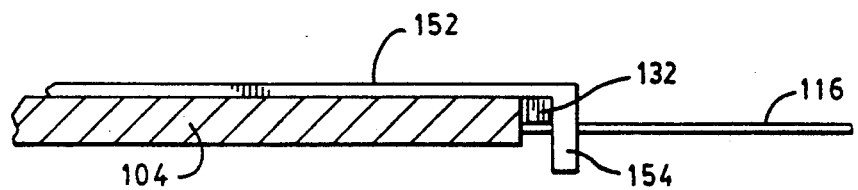
FIG. 4D is a side view as seen along line 4D—4D of FIG. 4B of the ESD protection device mated to the top surface of the SCP.
Figure 4E:
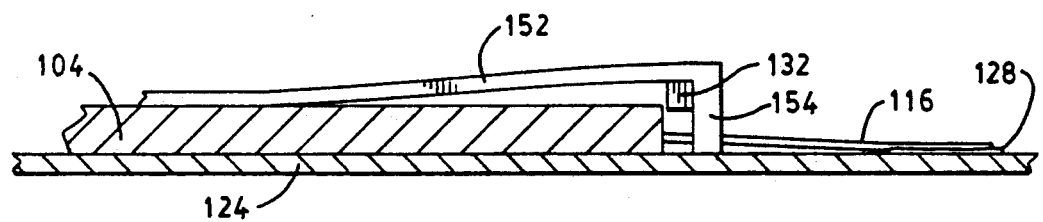
FIG. 4E is a side view as seen along line 4E—4E of FIG. 4C of the ESD protection device-SCP sub-assembly mated to the printed circuit board.

Referring now to FIGS. 3A-3B where like numerals designate previously described elements, there is shown a third embodiment of the ESD protection device 88 for the SCP 12' and the connector 38'. This third embodiment of the ESD protection device 88 is substantially similar to the second ESD protection device embodiment 64 described above. In contrast to the second embodiment, the clips of the second embodiment have been replaced with pull tabs 90, 92 so that only the adhesive (not shown) on the base section 94 in cooperation with the gripping members 70' secure this ESD protection device 88 to the top surface 14' of the SCP 12'. Like the second embodiment, this ESD protection device 88 comprises a base section 94 secured to the top surface 14' of the SCP 12' and a plurality of shorting arms 96 and gripping members 70' which are both integral to the base section 94. The plurality of gripping members 70', just as in the second ESD protection device embodiment, extend in an interdigitated spaced apart relationship with respect to the plurality of shorting arms 96 so as to provide the base section 94 with support and stability against lateral movement. Also, as in the second embodiment, each of the plurality of gripping members 70' comprises a first portion 78' extending along the top surface 14' of the SCP 12' and an integral second portion 80' which securely grasps the SCP 12' at an interface surface 18', 20'.

The plurality of shorting arms 96, as in the second embodiment, extend outwardly from the base section 94 in spaced apart relationship with respect to each other and in spaced apart alignment with respect to the plurality of connector pins 22', 24'. Unlike the second embodiment, however, each of the plurality of shorting arms 96 has only an integral first portion 98 extending outwardly and downwardly from the base section 94 to define a transverse edge portion 100 which engages the first portion 26' of a respective one L of the connector pins 22', 24'. This means that the transverse edge portions 100 always electrically interconnect the shorting arms 96 to the plurality of connector pins 22', 24', respectively, regardless of whether or not the connector pins 22', 24' are inserted into the complementary receptacles (not shown) of a connector (not shown) because this embodiment lacks the means for urging the transverse edge portions 100 away from their corresponding first portions 26'. Thus, only the physical removal of this ESD protection device 88 from the top surface 14' of the SCP 12' by grasping and pulling the pull tabs 90, 92 will electrically disconnect the shorting arms 96 from the connector pins 22', 24'.

As was the case in the second ESD protection device embodiment 64, the number of connector pins 22', 24' on either interface surface 18', 20' to be shorted together by this third ESD protection device embodiment 88 need not include all the connector pins 22', 24' as shown in FIGS. 3A-3B but may also be limited to any subset of all the conductive pins. Moreover, only a subset of all the connector pins 22', 24' on just one interface surface 18', 20' may be shorted together by this ESD protection device 88 while all the other connector pins 22', 24' remain unshorted.

Referring now to FIGS. 4A-4E, there is shown generally at 102 another PCB-ESD protection device combination of this invention comprising a fourth ESD protection device embodiment, a SCP 104 and a complementary connector 124. The SCP 104 in one embodiment may comprise a top surface 106, a bottom surface (not shown), and, between the top and bottom surfaces, a plurality of interface surfaces 108, 110, 112, 114. A plurality of connector pins 116, 118, 120, 122 are disposed on the interface surfaces 108, 110, 112, 114, respectively, in a substantially parallel and spaced apart relationship with respect to each other. As will be readily understood, the SCP 104 may house either a VLSI, LSI, or MSI semiconductor die or dies.

The plurality of connector pins 116, 118, 120, 122 are adapted for physical and electrical connection to the connector 124, typically a printed circuit board, having a substantially planar surface 126 on one selected side thereof. A plurality of surface pads 128 exist on the planar surface 126 in a complementary relationship with respect to the connector pins 116, 118, 120, 122 so as to accommodate the ready soldering of the connector pins 116, 118, 120, 122 to the respective ones of the surface pads 128.

In order to ensure that the connector pins 116, 118, 120, 122 are shorted until they are soldered to the complementary surface pads 128, the ESD protection device 130 is provided. This ESD protection device 130 comprises a plurality of electrically conductive bars 132, 134, 136, 138 disposed in overlying relationship with respect to the plurality of connector pins 116, 118, 120, 122 respectively and a spring structure 140 mounted to the top surface 106 of the SCP 104 for urging the plurality of conductive bars 132, 134, 136, 138 against the respective conductor pins 116, 118, 120, 122. The spring structure 140 has a central pad 142 securely mounted with an adhesive (not shown) to the top surface 106 of the SCP 104 and a plurality of spring members 144, 146, 148, 150 integral to the central pad 142 and corresponding in number to the number of electrically conductive bars 132, 134, 136, 138. Each spring member 144, 146, 148, 150 has an integral cantilevered portion 152 fixedly secured at one end to the central pad 142 and extending outwardly beyond the top surface and an integral pair of spaced apart depending leg portions 154, 156 extending downwardly on both sides of a respective one of the plurality of connector pins 116, 118, 120, 122 and beyond the bottom surface (not shown). Each corresponding electrically conductive bar 132, 134, 136, 138 is securely mounted with an adhesive (not shown) to its corresponding cantilevered portion 152 adjacent to the interface between its cantilevered portion 152 and its pair of leg portions 154, 156 so as to selectively engage its respective one of the plurality of connector pins 116, 118, 120, 122.

The plurality of spring members 144, 146, 148, 150 are yieldably biased by means well known in the art such as an built in resilient spring bias so as to urge their respective cantilevered portion 152 towards the top surface 106 and their respective electrically conductive bars 132, 134, 136, 138 against the connector pins 116, 118, 120, 122 respectively thereby creating an electrical interconnection therebetween. Thus, as is readily apparent from FIGS. 4A-4E, when the plurality of connector pins 116, 118, 120, 122 are not soldered to their complementary surface pads 128, the spring members 144, 146, 148, 150 urge their respective electrically conductive bar 132, 134, 136, 138 against and into electrical connection with their respective connector pins 116, 118, 120, 122. In this manner, the shorting of all of the connector pins 116, 118, 120, 122 is accomplished so as to effectively protect the semiconductor die (not shown) within the SCP 104 from ESD which could operate to damage the electrical circuitry in the semiconductor die.

Positioning the connector pins 116, 118, 120, 122 over the complementary surface pads 128 in the connector 124 in readiness for soldering operates to move and deflect upwards the leg portions 154, 156 of all the spring members 144, 146, 148, 150 against their yieldable bias, thereby moving all the electrically conductive bars 132, 134, 136, 138 out of physical and electrical connection with the connector pins 116, 118, 120, 122.

As will be readily apparent, the connector pins 116, 118, 120, 122 on all the interface surfaces 108, 110, 112, 114 need not be shorted together by this ESD protection device 104 but may be limited to those connector pins found in any select subset of all the interface surfaces.

Other embodiments of the invention including additions, subtractions, deletions, and other modifications of the preferred disclosed embodiments of the invention will be obvious to those skilled in the art and are within the scope of the following claims.

What is claimed is:

1. An electrostatic discharge (hereafter referred to as "ESD") protection device for use with a semiconductor chip package (hereafter referred to as "SCP") of the type having a top and opposite bottom surface and a pair of interface surfaces disposed between the top and bottom surfaces, each interface surface having a plurality of connector pins disposed thereon in a substantially parallel and spaced apart relationship with respect to each other, each connector pin having a portion extending outward from the interface surface and downward at its distal end so as to extend beyond the bottom surface, the ESD protection device comprising:

a) a base section secured to the bottom surface of the SCP; and b) a plurality of shorting arms integral to the base section and extending outward therefrom with distal end portions in spaced apart relationship with respect to each other and transversely disposed with respect to the plurality of connector pins, each shorting arm comprising a first portion fixedly secured to the base section and extending outwardly from the bottom surface, a knee portion extending from the first portion to define a bend in the shorting arm, and an intermediate portion extending from the bend towards a respective one of the connector pins so that the distal end portion extends over the respective one connector pin, each shorting arm further including means for yieldably biasing each shorting arm so as to urge the distal end portion thereof against its respective one connector pin thereby creating an electrical connection therebetween.

2. The ESD protection device of claim 1 wherein each connector pin further comprises a first portion extending outward from the interface surface, a second portion of substantially the same width as the first portion extending in a downward direction, a bent portion interconnecting the first and second portions, a third portion narrower than the first and second portions extending downward to its distal end, and an interface portion interconnecting the second and third portions, the knee portion of each shorting arm extending below the interface portion of each connector pin.

3. The ESD protection device of claim 2 wherein each shorting arm engages its corresponding connector pin at the first portion.

4. The ESD protection device of claim 1 further comprising an adhesive for securely mounting the base section to the bottom surface.

5. The ESD protection device of claim 1 further comprising end portions extending from opposite ends of the base section and integral therewith, each end portion defining a clip which can be removably secured around the top and bottom surfaces of the SCP so that the base section is securely mounted to the SCP.

6. An electrostatic discharge (hereafter referred to as "ESD") protection device for use with a semiconductor chip package (hereafter referred to as "SCP") of the type having a top and opposite bottom surface and a pair of interface surfaces disposed between the top and bottom surfaces, each interface surface having a plurality of connector pins disposed thereon in a substantially parallel and spaced apart relationship with respect to each other, each connector pin having a portion extending outward from the interface surface and downward at its distal end so as to extend beyond the bottom surface, the plurality of connector pins being structured for connection to a connector of the type having a plurality of receptacles complementary to the plurality of connector pins to accommodate the insertion of the plurality of connector pins into the respective receptacles; the ESD protection device comprising:

a) a base section secured to the bottom surface of the SCP; and b) a plurality of shorting arms integral to the base section and extending outward therefrom with distal end portions in spaced apart relationship with respect to each other and transversely disposed with respect to the plurality of connector pins, each shorting arm comprising a first portion fixedly secured to the base section and extending outwardly from the bottom surface, a knee portion extending from the first portion to define a bend in the shorting arm, and an intermediate portion extending from the bend towards a respective one of the connector pins so that the distal end portion extends over the respective one connector pin, each shorting arm further comprising means for yieldably biasing the shorting arm so as to urge the distal end portion thereof against its respective one connector pin thereby creating an electrical connection therebetween when the connectors pins are not inserted into the complementary receptacles in the connector, each knee portion being moved towards the bottom surface of the SCP against its yieldable bias so as disengage its distal end portion from its respective connector pin to break the electrical connection therebetween in response to the insertion of the connector pins into the respective receptacles.

7. The ESD protection device of claim 6 wherein each connector pin further comprises a first portion extending outward from the interface surface, a second portion of substantially the same width as the first portion extending in a downward direction, a bent portion interconnecting the first and second portions, a third portion narrower than the first and second portions extending downward to its distal end, and an interface portion interconnecting the second and third portions, the knee portion of each shorting arm extending below the interface portion of each connector pin and each receptacle being of sufficient width to accommodate the insertion of only the third portion of each respective connector pin therein.

8. The ESD protection device of claim 7 wherein each shorting arm engages its corresponding connector pin at the first portion.

9. The ESD protection device of claim 6 further comprising an adhesive for securely mounting the base section to the bottom surface.

10. The ESD protection device of claim 6 further comprising end portions extending from opposite ends of the base section and integral therewith, each end portion defining a clip which can be removably secured around the top and bottom surfaces of the SCP so that the base section is securely mounted to the SCP.

11. An electrostatic discharge (hereafter referred to as "ESD") protection device for use with a semiconductor chip package (hereafter referred to as "SCP") of the type having a top and opposite bottom surface and a pair of interface surfaces disposed between the top and bottom surfaces, each interface surface having a plurality of connector pins disposed thereon in a substantially parallel and spaced apart relationship with respect to each other, each connector pin having a portion extending outward from the interface surface and downward at its distal end so as to extend beyond the bottom surface, the ESD protection device comprising:
a) a base section having a planar surface overlaid on and secured to the top surface of the SCP; and
b) a plurality of shorting arms integral to the base section and extending outward therefrom in spaced apart relationship with respect to each other and in a spaced apart alignment with respect to the plurality of connector pins, each shorting arm having at least a first portion integral to the base section and extending outwardly and downwardly therefrom to define a transverse edge portion at its distal end moveable into engagement with a respective one of the connector pins.

12. The ESD protection device of claim 11 further comprising a plurality of spaced apart elongated gripping members extending from integral connection to the base section in interdigitated spaced apart relationship with respect to the plurality of shorting arms, each gripping member having a first portion extending along the top surface and an integral second portion for securely grasping the SCP at an interface surface.

13. The ESD protection device of claim 11 further comprising an adhesive for securely mounting the base section to the top surface.

14. The ESD protection device of claim 11 further comprising end portions extending from opposite ends of the base section and integral therewith, each end portion defining a tab which can be gripped so that the ESD device can be easily removed from the top surface.

15. The ESD protection device of claim 11 wherein the plurality of shorting arms further comprise second portions integral to the first portions respectively and extending outward therefrom with distal end portions in spaced apart relationship with respect to each other and in a spaced apart alignment with respect to the plurality of connector pins, each first portion being wider than its respective second portion so as to define the transverse edge portion therebetween, each shorting arm further including means for yieldably biasing each shorting arm so as to urge the transverse edge portion thereof against its respective one connector pin thereby creating an electrical connection therebetween.

16. The ESD protection device of claim 12 wherein each connector pin further comprises a first portion extending outward from the interface surface, a second portion of substantially the same width as the first portion extending in a downward direction, a bent portion interconnecting the first and second portions, a third portion narrower than the first and second portions extending downward to its distal end, and an interface portion interconnecting the second and third portions, the distal end portion of each shorting arm extending below the interface portion of each connector pin and each receptacle being of sufficient width to accommodate the insertion of only the third portion of each respective connector pin therein.

17. The ESD protection device of claim 15 wherein the transverse edge portion of each shorting arm engages its corresponding connector pin at the first portion.

18. The ESD protection device of claim 15 further comprising end portions extending from opposite ends of the base section and integral therewith, each end portion defining a clip which can be removably secured around the top and bottom surfaces of the SCP so that the base section is securely mounted to the SCP.

19. An electrostatic discharge (hereafter referred to as "ESD") protection device for use with a semiconductor chip package (hereafter referred to as "SCP") of the type having a top and opposite bottom surface and a pair of interface surfaces disposed between the top and bottom surfaces, each interface surface having a plurality of connector pins disposed thereon in a substantially parallel and spaced apart relationship with respect to each other, each connector pin having a portion extending outward from the interface surface and downward at its distal end so as to extend beyond the bottom surface, the plurality of connector pins being structured for connection to a connector of the type having a plurality of receptacles complementary to the plurality of connector pins to accommodate the insertion of the plurality of connector pins into the respective receptacles, the ESD protection device comprising:
   a) a base section having a planar surface overlaid on and secured to the top surface of the SCP; and
   b) a plurality of shorting arms integral to the base section and extending outward therefrom with distal end portions in spaced apart relationship with respect to each other and in a spaced apart alignment with respect to the plurality of connector pins, each shorting arm having a first portion integral to the base section and extending outwardly therefrom in integral connection to a respective one of the distal end portions, each first portion being wider than its respective distal end portion so as to define a transverse edge portion moveable into engagement with respect to one of the connector pins, each shorting arm further comprising means for yieldably biasing the shorting arm so as to urge the transverse edge portion thereof against its respective one connector pin thereby creating an electrical connection therebetween when the connectors pins are not inserted into the complementary receptacles in the connector, each first portion being moved towards the top surface of the SCP against its yieldable bias so as disengage its transverse edge from its respective connector pin to break the electrical connection therebetween in response to the insertion of the connector pins into the respective receptacles.

20. The ESD protection device of claim 19 further comprising a plurality of spaced apart elongated gripping members extending from integral connection to the base section in interdigitated spaced apart relationship with respect to the plurality of shorting arms, each gripping member having a first portion extending along the top surface and an integral second portion for securely grasping the SCP at an interface surface.

21. The ESD protection device of claim 19 wherein each connector pin further comprises a first portion extending outward from the interface surface, a second portion of substantially the same width as the first portion extending in a downward direction, a bent portion interconnecting the first and second portions, a third portion narrower than the first and second portions extending downward to its distal end, and an interface portion interconnecting the second and third portions, the distal end portion of each shorting arm extending below the interface portion of each connector pin and each receptacle being of sufficient width to accommodate insertion of only the third portion of each respective connector pin therein.

22. The ESD protection device of claim 19 wherein each shorting arm engages its corresponding connector pin at the first portion.

23. The ESD protection device of claim 19 further comprising an adhesive for securely mounting the base section to the top surface.

24. The ESD protection device of claim 19 further comprising end portions extending from opposite ends of the base section and integral therewith, each end portion defining a clip which can be removably secured around the top and bottom surfaces of the SCP so that the base section is securely mounted to the SCP.

25. An electrostatic discharge (hereafter referred to as "ESD") protection device for use with a semiconductor chip package (hereafter referred to as "SCP") of the type having a top and opposite bottom surface and a plurality interface surfaces disposed between the top and bottom surfaces, each interface surface having a plurality of connector pins extending outwardly therefrom in a substantially parallel and spaced apart relationship with respect to each other, the ESD protection device comprising:
   a) a plurality of electrically conductive bars, each disposed in an overlying relation with respect to the plurality of connector pins extending from each interface surface; and
   b) a spring structure mounted to the top surface of the SCP for urging the plurality of electrically conductive bars against the conductor pins, the spring structure comprising:
      i) a central pad securely mounted to the top surface of the SCP; and
      ii) a plurality of spring members integral to the central pad and corresponding in number to the number of electrically conductive bars, each spring member having a cantilevered portion fixedly secured at one end to the central pad and extending outwardly therefrom beyond the edge of the top surface of the SCP and two spaced apart depending leg portions integral to the cantilevered portion and extending downwardly on both sides of a respective one plurality of connector pins and beyond the bottom surface, the cantilevered portion and the depending leg portions of each spring member defining an interface therebetween adjacent which a respective one of the plurality of electrically conductive bars is fixedly disposed, each spring member further comprising means for yieldably biasing the spring member to move the cantilevered portion thereof towards the top surface of the SCP so as to urge the electrically conductive bar associated therewith against its respective one plurality of connector pins thereby creating an electrical interconnection therebetween.

26. The ESD protection device of claim 25 further comprising an adhesive for securely mounting the central pad to the top surface.

27. The ESD protection device of claim 25 wherein the electrically conductive bars are selected from the group comprising an elastic, electrically conductive foam, plastic, fiber, and foil.

28. The ESD protection device of claim 25 wherein the cantilevered portion further comprises a thin sheet fixedly secured at one end to the central pad, extending outwardly therefrom beyond the top surface of the SCP, and having an aperture disposed therebetween.

29. The ESD protection device of claim 25 further comprising an adhesive for securely mounting the respective electrically conductive bar to the cantilevered portion adjacent to the interface between the cantilevered portion and the leg portion.

30. An electrostatic discharge (hereafter referred to as "ESD") protection device for use with a semiconductor chip package (hereafter referred to as "SCP") of the type having a top and opposite bottom surface and a plurality interface surfaces disposed between the top and bottom surfaces, each interface surface having a plurality of connector pins extending outwardly therefrom in a substantially parallel and spaced apart relationship with respect to each other, the plurality of connector pins being structured for connection to a connector of the type having a plurality of surface pads complementary to the plurality of connector pins to accommodate the soldering of the plurality of connector pins onto the complementary plurality of surface pads, the ESD protection device comprising:
a) a plurality of electrically conductive bars, each disposed in an overlying relation with respect to the plurality of connector pins extending from each interface surface; and
b) a spring structure mounted to the top surface of the SCP for urging the plurality of electrically conductive bars against the conductor pins, the spring structure comprising:
 i) a central pad securely mounted to the top surface of the SCP; and
 ii) a plurality of spring members integral to the central pad and corresponding in number to the number of electrically conductive bars, each spring member having a cantilevered portion fixedly secured at one end to the central pad and extending outwardly therefrom beyond the edge of the top surface of the SCP and two spaced apart depending leg portions integral to the cantilevered portion and extending downwardly on both sides of a respective one plurality of connector pins and beyond the bottom surface, the cantilevered portion and the depending leg portions of each spring member defining an interface therebetween adjacent which a respective one of the plurality of electrically conductive bars is fixedly disposed, each spring member further comprising means for yieldably biasing the spring member to move the cantilevered portion thereof towards the top surface of the SCP so as to urge the electrically conductive bar associated therewith against its respective one plurality of connector pins thereby creating an electrical interconnection therebetween when the SCP is not positioned against a surface of the connector, each cantilevered portion thereof being moved away from the top surface of the SCP against the yieldable bias so as to disengage its electrically conductive bar from its respective plurality of connector pins on the interface surface to break the electrical connection therebetween in response to the positioning of the SCP against the surface of the connector.

31. The ESD protection device of claim 30 further comprising an adhesive for securely mounting the central pad to the top surface.

32. The ESD protection device of claim 30 wherein the electrically conductive bars are selected from the group comprising an elastic, electrically conductive foam, plastic, fiber, and foil.

33. The ESD protection device of claim 30 wherein the cantilevered portion further comprises a thin sheet fixedly secured at one end to the central pad, extending outwardly therefrom beyond the top surface of the SCP, and having an aperture disposed therebetween.

34. The ESD protection device of claim 30 further comprising an adhesive for securely mounting the respective electrically conductive bar to the cantilevered portion adjacent to the interface between the cantilevered portion and the leg portions.

* * * * *